(12) United States Patent
Noguchi

(10) Patent No.: US 6,611,939 B1
(45) Date of Patent: Aug. 26, 2003

(54) ITERATIVE DECODING OF MULTIPLY-ADDED ERROR-CORRECTING CODES IN A DATA PROCESSING ERROR CORRECTION DEVICE

(75) Inventor: Nobuaki Noguchi, Ehime (JP)

(73) Assignee: Matsushita Electrical Industrial co., Ltd. (JP)

( * ) Notice: Subject to any disclaimer, the term of this patent is extended or adjusted under 35 U.S.C. 154(b) by 0 days.

(21) Appl. No.: 09/622,859

(22) PCT Filed: Jan. 21, 2000

(86) PCT No.: PCT/JP00/00306

§ 371 (c)(1),
(2), (4) Date: Oct. 6, 2000

(87) PCT Pub. No.: WO00/45517

PCT Pub. Date: Aug. 3, 2000

(30) Foreign Application Priority Data

Jan. 26, 1999 (JP) ............................................. 11-17515

(51) Int. Cl.⁷ ............................................... G11C 29/00
(52) U.S. Cl. ....................................................... 714/764
(58) Field of Search .................................. 714/752, 764

(56) References Cited

U.S. PATENT DOCUMENTS

| | | | | |
|---|---|---|---|---|
| 4,750,178 A | * | 6/1988 | Sako et al. | 714/755 |
| 5,610,929 A | * | 3/1997 | Yamamoto | 714/785 |
| 5,898,708 A | * | 4/1999 | Tateishi et al. | 714/752 |
| 6,192,499 B1 | * | 2/2001 | Yang | 714/785 |

FOREIGN PATENT DOCUMENTS

| | | | |
|---|---|---|---|
| JP | 61-237522 | 10/1986 | .......... H03M/13/00 |
| JP | 64-47132 | 2/1989 | .......... H03M/13/00 |
| JP | 4-86032 | 3/1992 | ............ H04B/7/26 |
| JP | 5-252121 | 9/1993 | ........... H04B/14/04 |
| JP | 10-301658 | 11/1998 | .............. G06F/1/04 |
| JP | 10-301659 | 11/1998 | .............. G06F/1/04 |
| JP | 2892000124 | 7/2002 | .......... H03M/13/00 |

OTHER PUBLICATIONS

"The main points of error correction coding technolog", Electronics Essentials No. 20, (1986).

* cited by examiner

*Primary Examiner*—Albert Decady
*Assistant Examiner*—Esaw Abraham
(74) *Attorney, Agent, or Firm*—Wall Marjama & Bilinski LLP

(57) ABSTRACT

A data error correction device which performs iterative decoding for data to which error-correcting codes are multiply added is provided with a means 14 for detecting the presence or absence of uncorrectable codewords in the present decoding, a means 15 containing the uncorrectability detection result, corresponding to the immediately preceding decoding, a means 12 for detecting that syndromes of all codewords in the present decoding are zero, and a means 16 for judging the termination of the correction processing to terminate the iterative decoding when no uncorrectable codeword is detected in the immediately preceding decoding and the syndromes of all codewords are zero in the present decoding. Therefore, when the iterative decoding for data to which the error-correcting codes are multiply added is performed, the number of times of the iterative decoding can be reduced with ensuring the reliability of data as in the case where the data are corrected the maximum number of times, thereby realizing the reduced power consumption in the error correction processing.

2 Claims, 5 Drawing Sheets

ITERATIVE DECODING OF MULTIPLY-ADDED ERROR-CORRECTING CODES IN A DATA PROCESSING ERROR CORRECTION DEVICE

TECHNICAL FIELD

The present invention relates to a data error correction device which executes iterative decoding of multiply added error-correcting codes, in data processing.

BACKGROUND ART

Conventionally, data error correction devices which decode error-correcting codes having capabilities of correcting data errors are utilized in various data recording/reproduction apparatus, as a method for increasing the reliabilities of data processing systems.

Particularly in recent years, due to the high density recording to recording media or increased data transfer rate for the data processing apparatus, the probability of errors in data which are read from the recording media is increased. Accordingly, plural error-correcting codes each having a high error-correcting capability are added to the data, or iterative decoding in which the plural error-correcting codes are repeatedly decoded is performed in the data error correction device.

For example in CD-ROMs, an error-correcting code for music CD which is called CIRC and another two kinds of error-correcting codes are added to data. Further, the iterative decoding is performed for these two kinds of error-correcting codes. Similarly, also in DVD-ROMs or DVD-RAMs, the iterative decoding is performed for product codes.

Generally, when data are read from a recording medium to be transferred to the data processing apparatus, it is required that the demodulation processing, error correction processing, data transfer processing and the like should be executed without delaying the reading of the data. Accordingly, the data error correction device is designed to satisfy the requirements also when performing the iterative decoding of a predetermined number of times successively.

FIG. 3 is a block diagram illustrating a structure of a prior art data error correction device.

In the figure, numeral 31 denotes a syndrome calculation means for calculating a syndrome of input data. Numeral 32 denotes an error location/numeric value calculation means for calculating an error location and an error numeric value on the basis of the syndrome calculated by the syndrome calculation means 31. Numeral 33 denotes an uncorrectability detection means for detecting the presence or absence of uncorrectable codewords in the present decoding. Numeral 34 denotes a correction termination judgement means for judging the termination of the correction process. Numeral 35 denotes a control means for controlling the syndrome calculation means 31, the error location/numeric value calculation means 32, the uncorrectability detection means 33 and the correction termination judgement means 34. In addition, numeral 130 denotes a data error correction device which comprises the syndrome calculation means 31, the error location/numeric value calculation means 32, the uncorrectability detection means 33, the correction termination judgement means 34, and the control means 35.

Here, the error-correcting codes (code A and code B) are doubly added to the input data, respectively.

FIG. 4 is a flowchart showing an example of procedures of the iterative decoding which is repeated a predetermined number of times in the data error correction device as shown in FIG. 3. FIG. 5 is a flowchart showing an example of procedures of the decoding which is repeated less than the predetermined number of times in the data error correction device as shown in FIG. 3.

In FIGS. 4 and 5, the error-correcting codes which are doubly added, respectively, are the code A and the code B. A1 decoding, B1 decoding, A2 decoding and B2 decoding show the first decoding of the code A, the first decoding of the code B, the second decoding of the code A and the second decoding of the code B, respectively. That is, these figures show the processing in which the code A and the code B are alternately subjected to the iterative decoding twice, respectively. In addition, UNC(B2)=0 shows that no uncorrectable codeword is detected in the B2 decoding. When UNC(B2) is not 0, i.e., it is 1, it shows that the uncorrectable codeword is detected. The same things can be said of UNC(A1), UNC(B1) and UNC(A2) in FIG. 5.

Initially, the case (Prior Art 1) where error judgement is made by the iterative decoding of the predetermined number of times in the data error correction device is described with reference to FIGS. 3 and 4.

(Step S1) The syndrome calculation means 31 receives from outside the data to which the error-correcting codes, i.e., code A and code B are doubly added as described above, then calculates a syndrome of the code A which is added to the input data, and outputs the syndrome.

Then, the error location/numeric value calculation means 32 calculates the error location and error numeric value of the code A from the syndrome calculation means 31 on the basis of the syndrome calculated by the syndrome calculation means 31 and outputs these values to the outside as well as outputs the values calculated by the error location/numeric value calculation means 32 to the uncorrectability detection means 33.

Then, the uncorrectability detection means 33 detects the presence or absence of uncorrectable codewords in the present decoding (A1 decoding) from the values calculated by the error location/numeric value calculation means 32, and outputs the detection result.

Then, the correction termination judgement means 34 outputs a judgement result that the next B1 decoding is to be executed to the control means 35, regardless of the detection result of the uncorrectability detection means 33, i.e., regardless of the presence or absence of uncorrectable codewords.

Then, the error correction processing in the A1 decoding is terminated.

(Step S2) Next, the control means 35 controls the syndrome calculation means 31 and the like, whereby the next B1 decoding is executed.

The syndrome calculation means 31 calculates a syndrome of the code B which is added to the input data and outputs the syndrome. The error location/numeric value calculation means 32, the uncorrectability detection means 33 and the correction termination judgement means 34 operate in the same manner as in the above-mentioned A1 decoding (step: S1), and then the B1 decoding is terminated.

(Step S3) Then, also in the A2 decoding, the syndrome calculation means 31, the error location/numeric value calculation means 32, the uncorrectability detection means 33 and the correction termination judgement means 34 operate in the same manner as in the above-mentioned B1 decoding (step S2), and then the error correction processing is terminated.

(Step S4) Then, also in the B2 decoding, the syndrome calculation means 31, the error location/numeric value calculation means 32 and the uncorrectability detection means 33 operate in the same manner as in the above-mentioned A2 decoding (step S3), and a detection result showing the presence or absence of uncorrectable codewords in the last decoding (B2 decoding) is output.

(Step S5) Then, the correction termination judgement means 34 receives the detection result (UNC(B2)) from the uncorrectability detection means 33, and judges the termination of the correction processing (iterative decoding).

When the detection result is UNC(B2)=0 and shows that no uncorrectable codeword is detected, the correct termination judgement means 34 judges that all errors in the data are corrected, and outputs the judgement result that the correction is to be terminated to the control means 35. The control means 35 controls the syndrome calculation means 31 and the like, to execute the iterative decoding for data which are to be subjected to the error correction processing next, without interruption.

Inversely, when the detection result is UNC(B2)=1 and shows that the uncorrectable codeword is detected, the correction termination judgement means 34 judges that errors remain in the data, and outputs a judgement result judging the uncorrectability to the control means 35. The control means 35 controls the syndrome calculation means 31 and the like, to proceed to predetermined processing such as re-reading of the data which are being subjected to the error correction processing from the recording medium.

Thus, the data error correction device of Prior Art 1 is designed to read data successively also when executing the iterative decoding of the predetermined number of times successively, thereby always realizing the iterative decoding of the predetermined number of times. In this case, the number of times of the iterative decoding is set so that errors can be corrected also when data which are read from the recording medium have a high error probability.

Next, the case (Prior Art 2) where the error judgement is made by the decoding which is repeated less than the predetermined number of times in the data error correction device is described with reference to FIGS. 3 and 5.

(Step S1) Also in the A1 decoding of the Prior Art 2, the syndrome calculation means 31, the error location/numeric value calculation means 32 and the uncorrectability detection means 33 operate in the same manner as in the A1 decoding of the Prior Art 1. Then, the uncorrectability detection result showing the presence or absence of uncorrectable codewords in the present decoding (A1 decoding) is output.

(Step S2) Then, the correction termination judgement means 34 receives the uncorrectability detection result from the uncorrectability detection means 33. When no uncorrectable codeword is detected in the present decoding (A1 decoding) (UNC(A1)=0), the judgement means 34 judges that all errors in the data are corrected, and outputs the judgement result that the correction is to be terminated. On the other hand, when the uncorrectable codeword is detected (UNC(A1)=1), the judgement means 34 judges that errors remain in the data, and outputs the judgement result that the next decoding is to be performed.

Then, the control means 35 controls the syndrome calculation means 31 and the like. When the correction is to be terminated, the iterative decoding for data which are to be subjected to the error correction processing next is executed without interruption. In this case, the correction is terminated without performing the remaining B1 decoding (steps S3 and S4), A2 decoding (steps S5 and S6), and B2 decoding (steps S7 and S8).

On the other hand, when the next decoding is to be performed, the control means 35 controls the syndrome calculation means 31 and the like, to perform the B1 decoding as in steps S1 and S2 in the A1 decoding (steps S3 and S4).

Thereafter, when the correction is not terminated, the A2 decoding (steps S5 and S6) and the B2 decoding (steps S7 and S8) is performed as in the steps S1 and S2 in the A1 decoding.

In the above-mentioned Prior Art 2, the detection result showing the presence or absence of uncorrectable codewords in the present decoding is referred to at every decoding. Then, when no uncorrectable codeword is detected in the present decoding, it is judged that all errors in the data are corrected, and then the error correction processing is terminated while the number of times of the decoding is less than the predetermined number of times.

At present, the data recording/reproduction apparatus are not only connected to stationary type data processing apparatus but also can be connected to portable type data processing apparatus. Accordingly, in the data error correction devices which are utilized in the data recording/reproduction apparatus, the low power consumption is required.

However, when data are read stably, in the data error correction device, the data error probability is low. Accordingly, when the number of times of the iterative decoding is set according to the case where the data error probability is high as in the above-mentioned Prior Art 1, all errors are corrected in the first half of the iterative decoding and there is no error to be corrected in the latter half, in most cases. However, the power is consumed in the extra decoding. Therefore, in order to reduce the power consumption in the data error correction device, it is an effective solution that the number of times of the iterative decoding is reduced, thereby lowering the operation rate of the data error correction device.

Then, it is readily conceivable that the error correction method of the Prior Art 2 is adopted. However, the error correction method of Prior Art 2 has a following problem. That is, in the Prior Art 2, even in the case where no uncorrectable codeword is detected and the correction is terminated, if the cause of no uncorrectable codeword being detected is that a different codeword due to an error is judged to have no error, the processing is terminated without performing the iterative decoding though there is errors. In addition, these are some cases even when the correctable number of errors are corrected and no uncorrectable codeword is detected, erroneous codewords are corrected to different codewords by the error correction and then the iterative decoding processing is terminated. Thus, the Prior Art 2 has the problem that the iterative decoding is terminated even when there is a possibility that errors could be corrected if the next decoding is performed. That is, it is undesirable to decrease the reliability of data after the error correction is terminated, to reduce the power consumption.

The present invention is made to solve the above-mentioned problems. An object of the present invention is to provide a data error correction device which enables to reduce the number of times of the iteration with ensuring the same reliability of the data as that in the case where the iterative decoding of the predetermined maximum number of times is performed, thereby reducing the power consumption in the error correction processing means.

DISCLOSURE OF THE INVENTION

According to the present invention (claim 1), in a data error correction device which corrects errors in data by subjecting error-correcting codes which are multiply added to the data, to iterative decoding up to a predetermined number of times, error correction processing is terminated when it is judged that the data have no error even when the number of times of the decoding is less than the predetermined number of times.

According to the present invention (claim 1), when the errors in the data are corrected by subjecting the error-correcting codes which are multiply added to the data, to the iterative decoding of the predetermined number of times, the iterative decoding is terminated to terminated the error correction processing when it is judged that the data have no error even when the number of the decoding is less than the predetermined number of times. Therefore, the number of times of the decoding can be reduced with ensuring the reliability of the data.

According to the present invention (claim 2), the data error correction device of claim 1 comprises: uncorrectability detection means for detecting presence or absence of uncorrectable codewords in a present decoding; detection result holding means containing a result of the detection by the uncorrectability detection means, corresponding to decoding immediately precedent to the present decoding; syndrome zero detection means for detecting that syndromes of all codewords in the present decoding are zero; and correction termination judgement means for judging termination of the correction processing when no uncorrectable codeword is detected in the decoding immediately precedent to the present decoding and the syndromes of all the codewords in the present decoding are zero.

According to the present invention (claim 2), in the data error correction device of claim 1, the correction termination judgement means judges that the data have no error and judges the termination of the correction processing when no uncorrectable codeword is detected in the decoding immediately precedent to the present decoding and the; syndromes of all codewords, which are detected by the syndrome zero detection means, are zero in the present decoding. Therefore, the number of times of the iterative decoding can be reduced with ensuring the reliability of the data as in the case where the iterative decoding of the predetermined maximum number of times is performed.

According to the present invention (claim 3), the data error correction device of claim 1 or 2 further comprises: control means for stopping a clock signal which is supplied to the data error correction device, during a period after the error correction processing is terminated when the number of times of the decoding is less than the predetermined number of times, till the iterative decoding for next data is started.

According to the present invention (claim 3), in the data error correction device of claim 1 or 2, the clock signal which is supplied to the data error correction device is stopped during a period after the error correction processing is terminated when the number of times of the decoding is less than the predetermined number of times, till the iterative decoding for the next decoding is started. Therefore, the power consumption of the data error correction device can be further reduced.

BEST MODE FOR CARRYING OUT THE INVENTION

Hereinafter, an embodiment of the present invention will be described in detail with reference to FIGS. 1 and 2.

Figure 1:
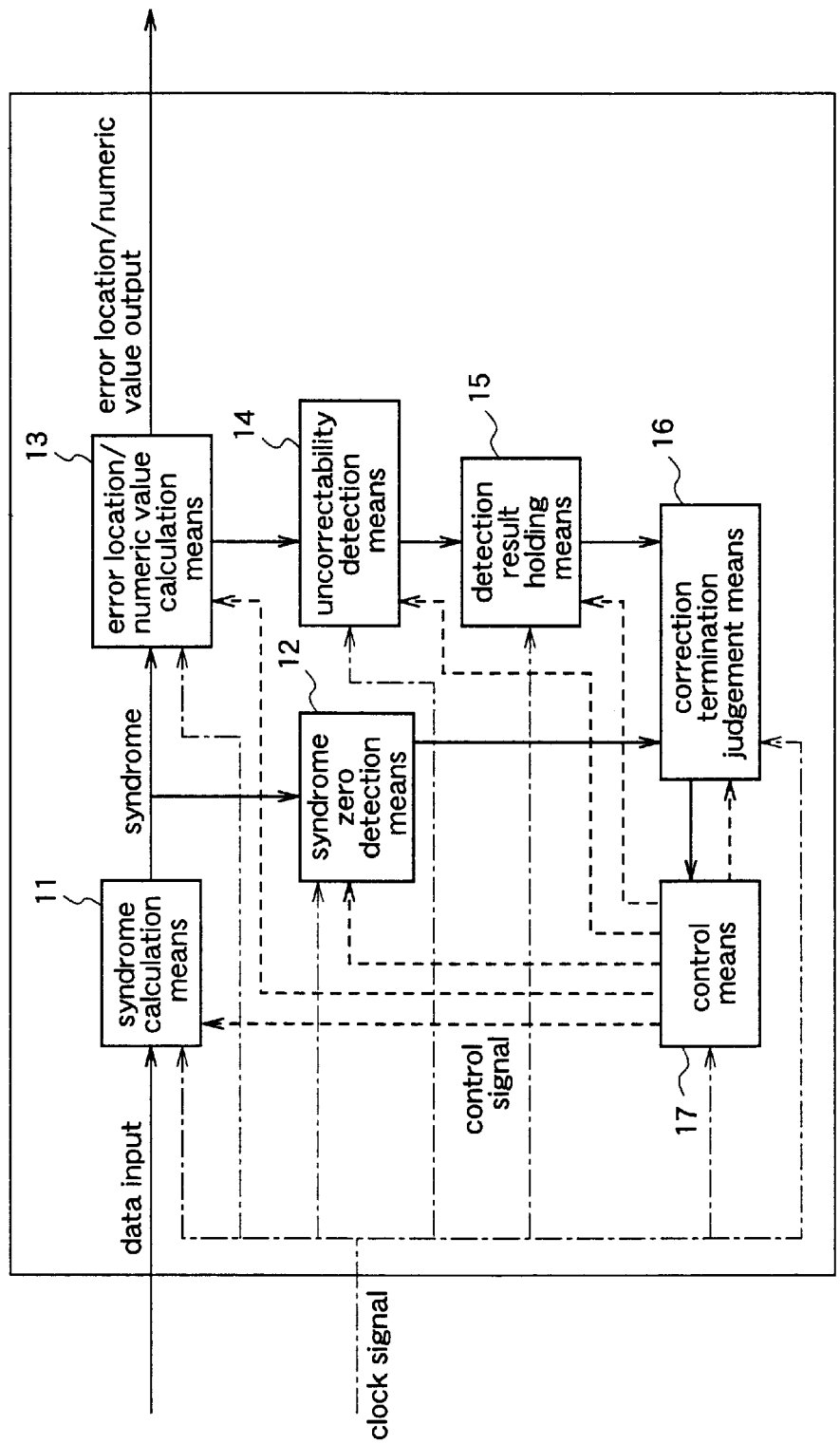
FIG. 1 is a block diagram illustrating a structure of a data error correction device according to an embodiment of the present invention.

FIG. 1 is a block diagram illustrating a structure of a data error correction device according to the embodiment of the present invention.

In the figure, numeral 11 denotes a syndrome calculation means for calculating a syndrome of input data. Numeral 12 denotes a syndrome zero detection means for detecting that syndromes of all codewords in the present decoding are zero. Numeral 13 denotes an error location/numeric value calculation means for calculating an error location and an error numeric value on the basis of the syndrome calculated by the syndrome calculation means 11. Numeral 14 denotes an uncorrectability detection means for detecting the presence or absence of uncorrectable codewords in the present decoding. Numeral 15 denotes a detection result holding means which contains the detection result corresponding to the immediately preceding decoding in the uncorrectability detection means 14. Numeral 16 denotes a correction termination judgement means for judging the termination of the correction processing. Numeral 17 denotes a control means for controlling the syndrome calculation means 11, the syndrome zero detection means 12, the error location/numeric value calculation means 13, the uncorrectability detection means 14, the detection result holding means 15, and the correction termination judgement means 16. In addition, numeral 20 denotes a data error correction device which comprises the syndrome calculation means 11, the syndrome zero detection means 12, the error location/numeric value calculation means 13, the correction detection means 14, the detection result holding means 15, the correction termination judgement means 16, and the control means 17.

Here, error-correcting codes (code A and code B) are added doubly to the data which are input to the data error correction device 20.

Figure 2:
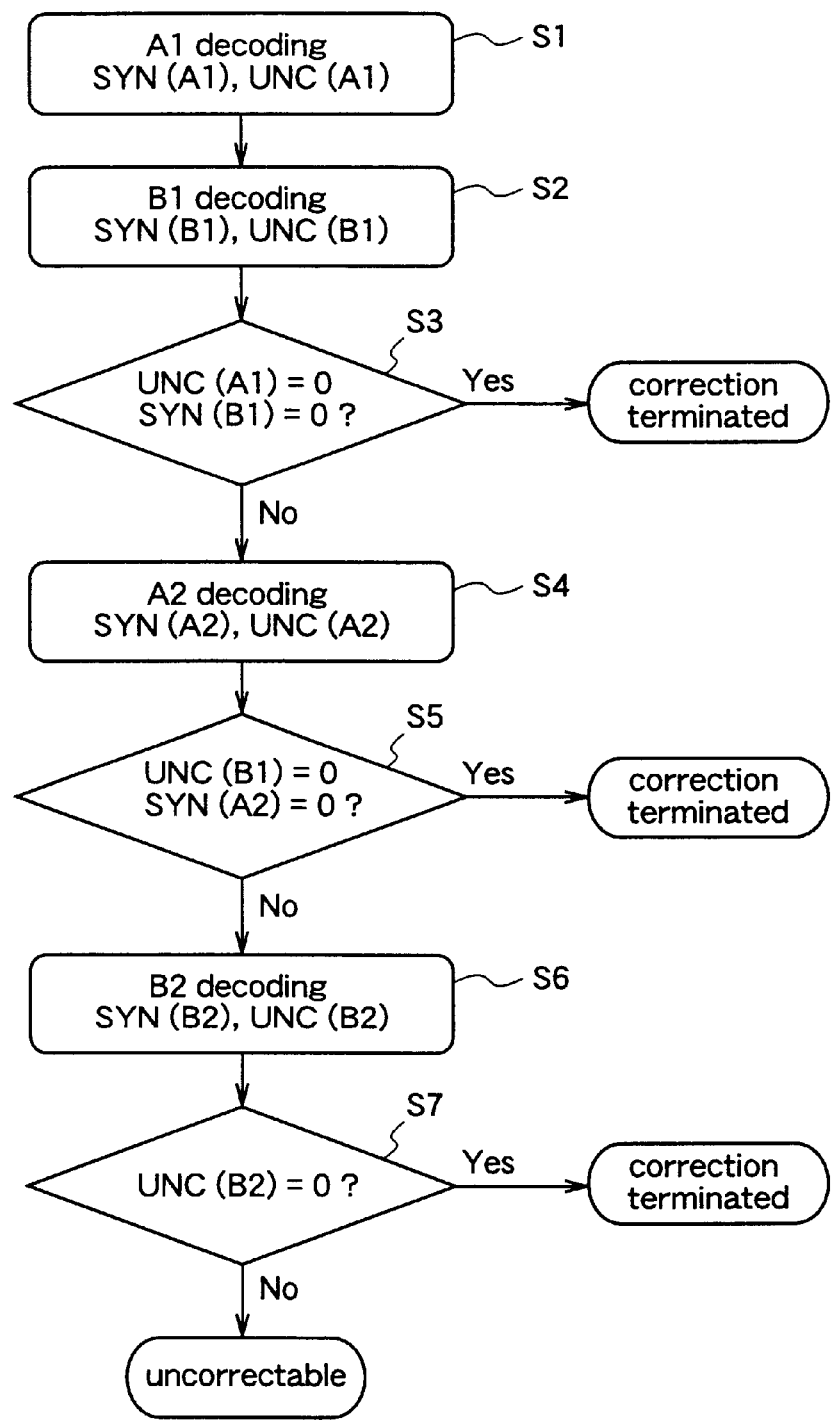
FIG. 2 is a flowchart showing an example of procedures of iterative decoding in the data error correction device according to the embodiment of the present invention.
Figure 3:
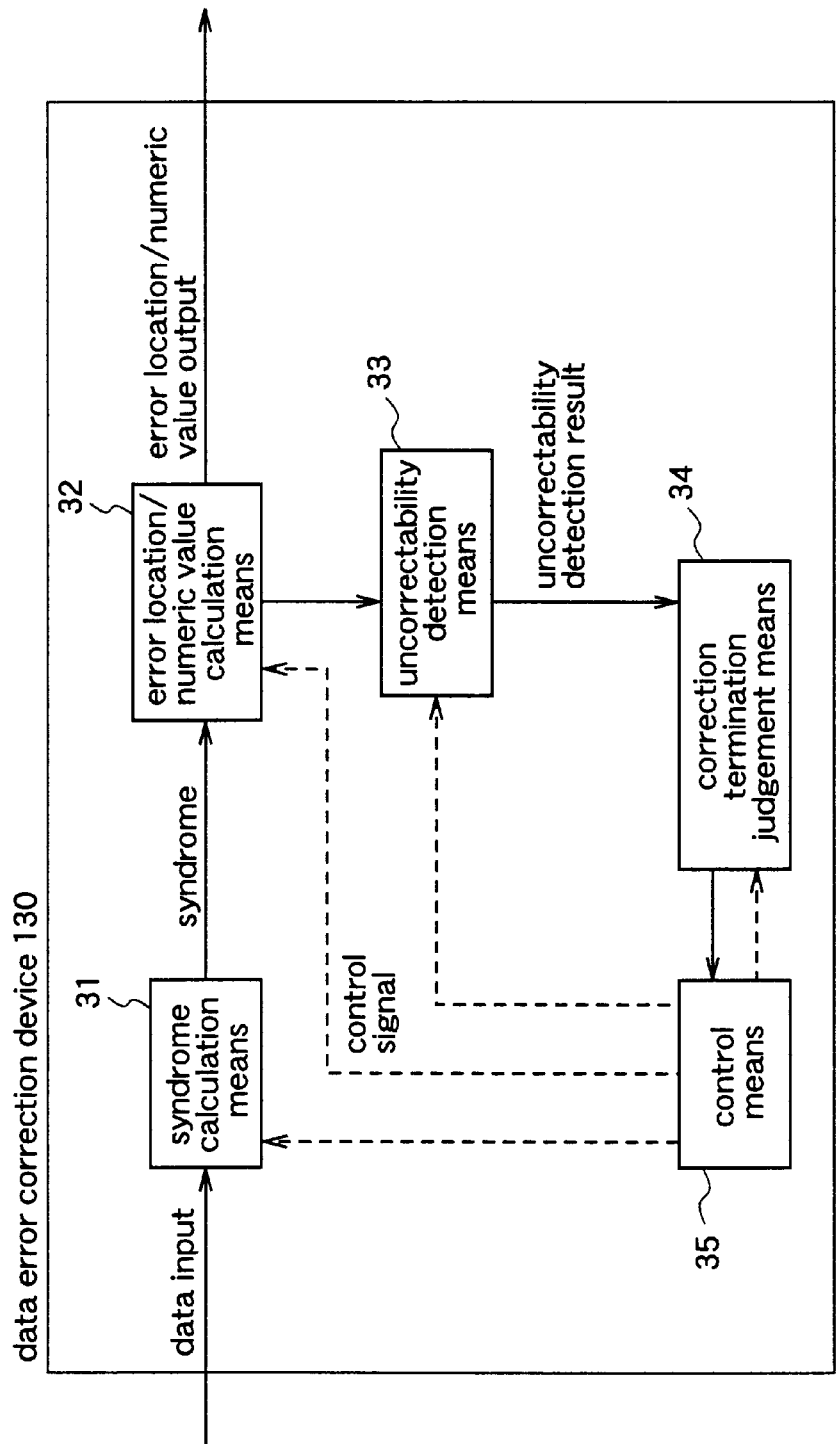
FIG. 3 is a block diagram illustrating a structure of a prior art data error correction device.
Figure 4:
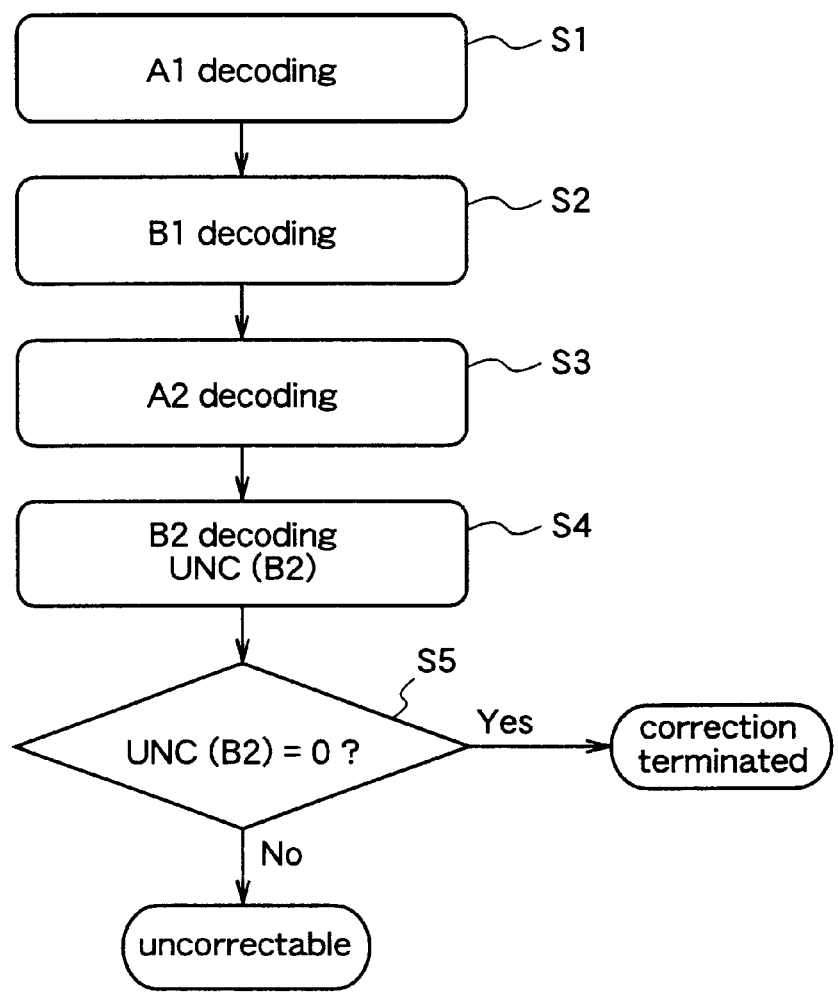
FIG. 4 is a flowchart showing an example of procedures of iterative decoding in the prior art data error correction device.
Figure 5:
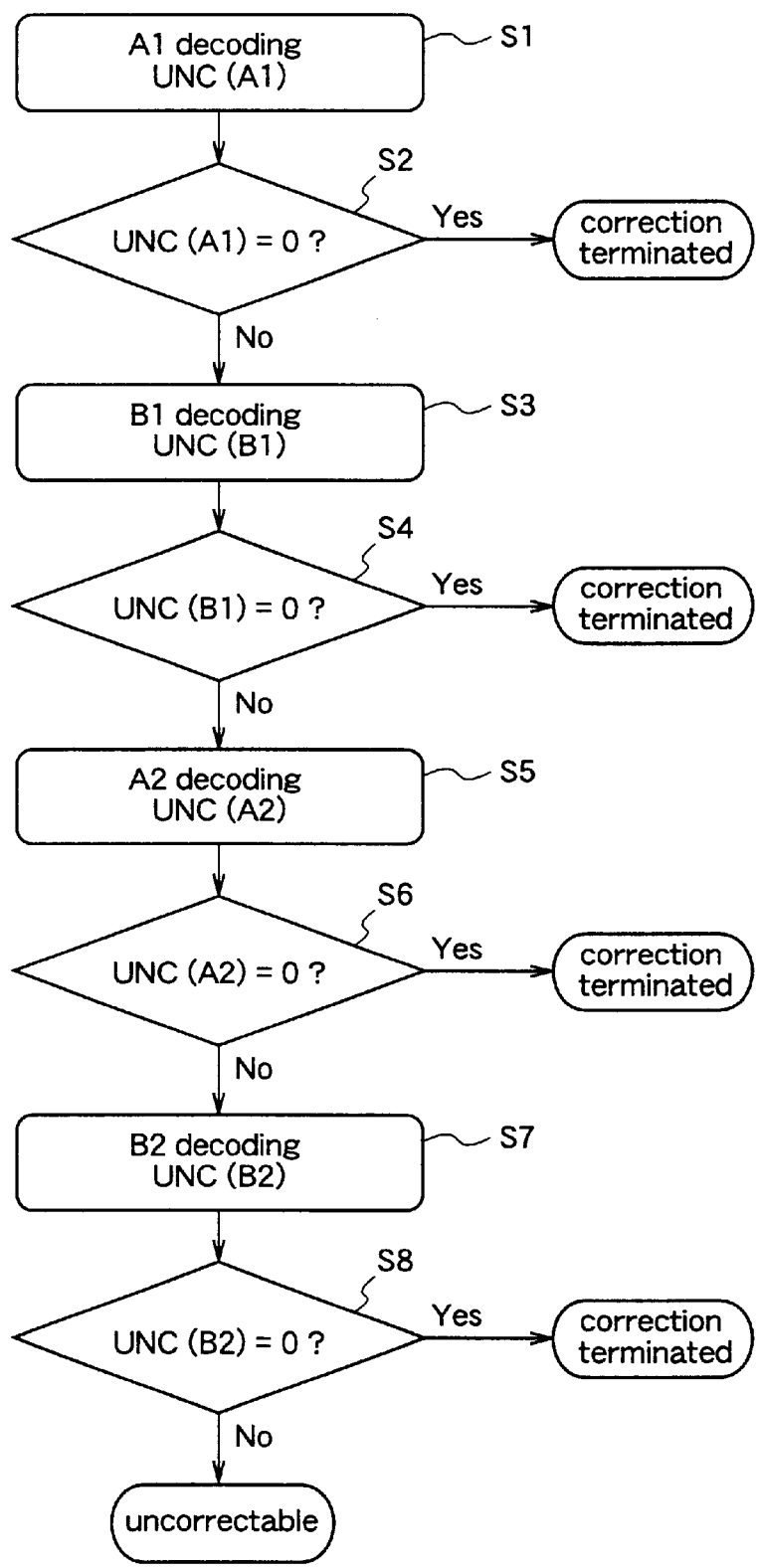
FIG. 5 is a flowchart showing an example of procedures of iterative decoding in the prior art data error correction device.

FIG. 2 is a flowchart showing an example of procedures of the iterative decoding of a predetermined number of times in the data error correction device shown in FIG. 1.

In the figure, the error-correcting codes which are added doubly to the data are the code A and code B. A1 decoding, B1 decoding, A2 decoding and B2 decoding show the first decoding for the code A, the first decoding for the code B, the second decoding for the code A and the second decoding for the code B, respectively. That is, FIG. 2 shows the error correction processing in which the code A and code B are alternately subjected to the iterative decoding twice, respectively. In addition, UNC(A1)=0 shows that no uncorrectable codeword is detected in the A1 decoding. When UNC(A1) is not 0, i.e., it is 1, it shows that the uncorrectable codeword is detected. The same things can be said of the UNC(B1), U,NC(A2) and UNC(B2). In addition, SYN(A1)=0 shows that syndromes of all codewords are zero in the A1 decoding. When SYN(A1) is not 0, i.e., it is 1, it shows that the syndromes of not all the codewords are zero.

Next, the operation of the error correction processing in the so-constructed data error correction device according to this embodiment is described with reference to FIGS. 1 and 2.

(Step S1) Initially, the syndrome calculation means 11 receives from outside data to which the error-correcting codes, i.e., code A and code B are doubly added as described above, calculates a syndrome of the code A which is added to the input data, and outputs the syndrome to the syndrome zero detection means 12 and the error location/numeric value calculation means 13.

Then, the error location/numeric value calculation means 13 calculates the error location and an error numeric value of the code A from the syndrome calculation means 11 on the basis of the syndrome calculated by the syndrome calculation means 13. 11, and outputs these values to the outside as well as outputs the values calculated by the error location/numeric value calculation means 13 to the uncorrectability detection means 14.

Then, the uncorrectability detection means 14 detects the presence or absence of uncorrectable codewords in the present decoding (A1 decoding) from the values calculated by the error location/numeric value calculation means 13, and outputs the detection result.

Then, the detection result holding means 15 receives the detection result of the uncorrectability detection means 14, and contains the result.

On the other hand, the syndrome zero detection means 12 detects that the syndromes from the syndrome calculation means 11 are zero, i.e., whether or not syndromes of all codewords are zero in the present decoding (A1 decoding), and outputs the detection result.

Then, the correction termination judgement means 16 receives the detection result from the syndrome zero detection means 12. However, there is no output from the detection result holding means 15 in the present decoding (A1 decoding). Therefore, the judgement means 16 outputs the result that the iterative decoding is not terminated even when SYN(A1)=0 (always UNC(A1)=0 in this case), to the control means 17, because these is a possibility that an error is added to a codeword in the code A resulting in a different codeword and the error cannot be detected in this case.

Then, the error correction processing in the A1 decoding is terminated.

(Step S2) Next, the control means 17,receives the result from the correction termination judgement means 16, and controls the syndrome calculation means 11 and the like to execute the B1 decoding.

To be specific, the syndrome calculation means 11 calculates a syndrome of the code B which is added to the input data, and outputs the syndrome to the syndrome zero detection means 12 and the error location/numeric value calculation means 13.

Then, the error location/numeric value calculation means 13 calculates an error location and an error numeric value of the code B from the syndrome calculation means 11 on the basis of the syndrome calculated by the syndrome calculation means 11, and outputs these values to the outside, as well as outputs the values calculated by the error location/numeric value calculation means 13 to the uncorrectability detection means 14.

Then, the uncorrectability detection means 14 detects the presence or absence of uncorrectable codewords in the present decoding (B1 decoding) from the values calculated by the error location/numeric value calculation means 13, and outputs the detection result.

Then, the detection result holding means 15 receives the detection result of the uncorrectability detection means 14, contains the result, and outputs the detection result which has been contained, corresponding to the immediately preceding decoding, to the correction termination judgement means 16.

On the other hand, the syndrome zero detection means 12 detects that the syndromes from the syndrome calculation means 11 are zero, i.e., whether or not the syndromes of all codewords in the present decoding (B1 decoding) are zero, and outputs the detection result.

(Step S3) Then, the correction termination judgement means 16 receives the detection result from the syndrome zero detection means 12 (SYN(B1)) and the detection result from the detection result holding means 15 (UNC(A1)), and judges the termination of the correction processing (iterative decoding). The condition for terminating the iterative decoding is that no uncorrectable codeword is detected in the immediately preceding decoding and the syndromes of all the codewords are zero in the present decoding. To be specific, when UNC(A1)=0 and SYN(B1)=0, it is judged that the all errors are corrected, and thereby the judgement result that the iterative decoding is to be terminated is output to the control means 17. That is, even if the iterative decoding is not terminated and the next A2 decoding is executed, since SYN(B1)=0, the correction of the data was not performed in the B1 decoding, and no uncorrectable codeword is detected in the next A2 decoding. Since the data are not changed in the B1 decoding, SYN(A2) is always 0 and thus the correction of the data is not performed. Therefore, SYN is always 0 however often the decoding is repeated thereafter. Accordingly, the reliability of data in the case where the error correction is terminated at the B1 decoding and that in the case where the iterative decoding of the maximum number of times is performed are equal.

On the other hand, when UNC(A1)=1 or SYN(B1)=1, the error correction processing in the B1 decoding is terminated and the judgement result that the next A2 decoding is to be performed is output to the control means 17.

Then, when the judgement result from the correction termination judgement means 16 indicates that the correction is to be terminated, the control means 17 controls the syndrome calculation means 11 and the like to execute the iterative decoding for data which are to be subjected to the error correction processing next, without interruption. On the other hand, when the next decoding is to be performed, the control means 17 control the syndrome calculation means and the like to execute steps S4 and S5 of the A2 decoding, like steps S2 and S3 of the B1 decoding.

To be specific, when the A2 decoding (steps S4 and S5) is executed, like the B1 decoding (steps S2 and S3), the A2 decoding is executed by the syndrome calculation means 11, the error location/numeric value calculation means 13, the uncorrectability detection means 14, the detection result holding means 15, the syndrome zero detection means 12 and the correction termination judgement means 16, and the termination of the correction processing (iterative decoding) is judged. That is, when UNC(B1)=0 and SYN(A2)=0, it is judged that all errors are corrected and then the iterative decoding is terminated. When UNC(B1)=1 or SYN(A2)=1, the next B2 decoding is performed.

Then, also when the B2 decoding (steps S6 and S7) is to be executed, like the A2 decoding (steps S4 and S5), the B2 decoding is executed by the syndrome calculation means 11, the error location/numeric value calculation means 13, the uncorrectability detection means 14 and the syndrome zero detection means 12.

However, since the B2 decoding is the last decoding, the detection result holding means 15 receives the detection result of the uncorrectability detection means 14, and outputs the detection result to the correction termination judgement means 16.

In addition, the correction termination judgement means 16 also receives the detection result from the syndrome zero detection means 12. However, since the B2 decoding is the last decoding, the detection result is abandoned and the judgement means 16 makes the judgement on the basis of only the detection result (UNC(B2)) from the detection result holding means 15. When UNC(B2)=0, it is judged that all errors are corrected. When UNC(B2)=1, it is judged the error to be uncorrectable. Then, the iterative decoding is terminated (S7).

Here, the control means 17 stops the correction processing in the data error correction device during a period from the termination of the iterative decoding to the start of the iterative decoding for the next data, which is generated by the reduction of the number of times of the iterative decoding. Therefore, a clock signal (see in FIG. 1) which is supplied to the data error correction device can be stopped. Accordingly, the power consumption can be further reduced.

As described above, when the data error correction device according to this embodiment of the present invention is to correct errors in data by subjecting the error-correcting codes which are multiply added to the data, to the iterative decoding of predetermined number of times, this device terminates the iterative decoding to terminate the error correction processing when it is judged that the data have no error even when the number of times of the decoding is less than the predetermined number of times. Therefore, the number of times of the iterative decoding can be reduced with ensuring the reliability of data.

In addition, the judgement that the data have no error is made in the following way. That is, when no uncorrectable codeword is detected by the uncorrectability detection means in the decoding immediately precedent to the present decoding and the syndromes of all codewords, which are detected by the syndrome zero detection means in the present decoding, are zero, the correction termination judgement means judges the termination of the correction processing. Therefore, the number of times of the iterative decoding can be reduced with ensuring the reliability of data as in the case where the iterative decoding of the predetermined maximum number of times is performed.

Further, the clock signal which is supplied to the data error correction device is stopped during a period after the error correction processing is terminated when the decoding has been repeated less than the predetermined number of times, till the iterative decoding for the next data is started. Therefore, the power consumption in the data error correction device can be further reduced.

INDUSTRIAL AVAILABILITY

As describe above, the data error correction device according to the present invention can reduce the number of times of the iterative decoding with ensuring the reliability of data as in the case where the iterative decoding of the predetermined maximum number of times is performed.

Further, the supply of the clock signal can be stopped in a period during which the error correction means is stopped, which period is generated by the reduction of the number of times of the iterative decoding. Therefore, the power consumption in the error correction processing means can be reduced.

What is claimed is:

1. A data error correction device which corrects errors in data by subjecting error-correcting codes which are multiply added to the data, to iterative decoding up to a predetermined number of times, said data error correction device terminating the error correction processing when it judges that the data have no error even when the number of times of the decoding is less than the predetermined number of times, and stopping a clock signal which is supplied to the data error correction device during a period until the iterative decoding for next data is started, said device comprising:

uncorrectability detection means for detecting presence or absence of uncorrectable codewords in a present decoding;

detection result holding means containing a result of the detection by the uncorrectability detection means, corresponding to decoding immediately precedent to the present decoding;

syndrome zero detection means for detecting that syndromes of all codewords in the present decoding the zero;

correction termination judgement means for judging termination of the correction processing when no uncorrectable codeword is detected in the decoding immediately precedent to the present decoding and the syndromes of all the codewords in the present decoding and zero; and control means for stopping the clock signal which is supplied to the data error correction device during a period after the error correction processing is terminated in accordance with the correction termination judgement means when the number of times of the decoding is less than the predetermined number of times, till the iterative decoding for the next data is started.

2. A data error correction method of correcting errors in data by subjecting error-correcting codes which are multiply added to the data, to iterative decoding up to a predetermined number of times, wherein even when the number of times of the decoding is less than the predetermined number of times, the error correction processing is terminated when it is judged that the data have no error, and a clock signal which is necessary for the error correction processing is stopped during a period until the iterative decoding for next data is started, said method including the steps of:

an uncorrectability detection step of detecting presence or absence of uncorrectable codewords in a present decoding;

a detection result holding step of containing a result of the detection in the uncorrectability detection step, corresponding to decoding immediately precedent to the present decoding;

a syndrome zero detection step of detecting that syndromes of all codewords in the present decoding are zero;

a correction termination judgement step of judging termination of the correction processing when no uncorrectable codeword is detected in the decoding immediately precedent to the present decoding and the syndromes of all the codewords in the present decoding are zero; and a control step of stopping a clock signal which is necessary for the error correction processing during a period after the error correction processing during a period after the error correction processing is terminated in accordance with the correction processing judgement step when the number of times of the decoding is less than the predetermined number of times, till the iterative decoding for the next data is started.

* * * * *